(12) United States Patent
Lee

(10) Patent No.: US 9,331,632 B2
(45) Date of Patent: May 3, 2016

(54) INTEGRATED CIRCUIT FOR MIXING MILLIMETER-WAVELENGTH SIGNALS

(75) Inventor: Cheol-Woong Lee, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 460 days.

(21) Appl. No.: 13/490,703

(22) Filed: Jun. 7, 2012

(65) Prior Publication Data

US 2013/0281029 A1 Oct. 24, 2013

Related U.S. Application Data

(60) Provisional application No. 61/635,101, filed on Apr. 18, 2012.

(51) Int. Cl.
*H03D 9/00* (2006.01)
*H03D 7/12* (2006.01)

(52) U.S. Cl.
CPC ... *H03D 7/12* (2013.01); *H03D 9/00* (2013.01)

(58) Field of Classification Search
USPC ............ 455/73, 67.16, 258, 324, 272, 276.1, 455/304, 139, 180.3, 205, 225; 333/139, 333/26, 33, 109, 129, 110, 112, 118, 120, 333/132
See application file for complete search history.

(56) References Cited

U.S. PATENT DOCUMENTS

| | | | | |
|---|---|---|---|---|
| 5,890,051 A * | 3/1999 | Schlang | ................ | H04B 1/405 455/315 |
| 6,369,700 B1 | 4/2002 | Yamada | | |
| 7,489,266 B2 | 2/2009 | Ohtake et al. | | |
| 8,971,389 B2 * | 3/2015 | Okada | ...................... | H04B 1/40 375/219 |
| 2003/0022694 A1* | 1/2003 | Olsen | ..................... | G01V 8/005 455/562.1 |
| 2005/0221786 A1* | 10/2005 | Nakano | .................... | H04B 1/04 455/324 |
| 2007/0021085 A1* | 1/2007 | Kroeger | ................. | H04B 7/086 455/272 |
| 2007/0155348 A1 | 7/2007 | Razavi et al. | | |
| 2011/0003571 A1* | 1/2011 | Park | ...................... | H03B 27/00 455/258 |
| 2011/0025431 A1* | 2/2011 | Spiegel | .................... | H01Q 3/30 333/139 |
| 2011/0075581 A1 | 3/2011 | Mihota | | |
| 2011/0130092 A1 | 6/2011 | Yun et al. | | |

OTHER PUBLICATIONS

Ali Parsa and Behzad Razavi, "A New Transceiver Architecture for the 60-GHz Band", IEEE Journal of Solid State circuits, vol. 44, No. 3, pp. 751-762, Mar. 2009.*
Fakharzadeh, et al., "CMOS Phased Array Transceiver Technology for 60 GHz Wireless Applications," IEEE Transactions on Antennas and Propagation, vol. 58, No. 4, Apr. 2010, pp. 1093-1104.
Henk H., "Millimeter-Wave Structures and Power Sources", Vienna, Austria, Dec. 31, 2000, pp. 202-206, XP055072538, [retrieved on Jul. 23, 2013], figure 1.
International Search Report and Written Opinion—PCT/US2013A37240—ISA/EPO—Aug. 1, 2013.

(Continued)

*Primary Examiner* — Ganiyu A Hanidu
(74) *Attorney, Agent, or Firm* — Liberty E. Mann

(57) ABSTRACT

An integrated circuit is described. The integrated circuit includes millimeter-wavelength transceiver circuitry. The millimeter-wavelength transceiver circuitry includes a local oscillator that generates a millimeter-wavelength oscillator signal. The millimeter-wavelength transceiver circuitry also includes mixers coupled to the local oscillator. The mixers are within an area without millimeter-wavelength structures. The mixers convert signals based on the millimeter-wavelength oscillator signal.

34 Claims, 10 Drawing Sheets

(56) References Cited

OTHER PUBLICATIONS

Okada K., et al., "A full 4-channel 6.3Gb/s 60GHz direct-conversion transceiver with low-power analog and digital baseband circuitry", Solid-State Circuits Conference Digest of Technical Papers (ISSCC), 2012 IEEE International, IEEE, Feb. 19, 2012, pp. 218-220, XP032154435, DOI: 10.1109/ISSCC.2012.6176982, ISBN: 978-1-4673-0376-7, figures 12.3.1, 12.3.7.

Park, et al., "A 60 GHz Integrated Antenna Array for High-Speed Digital Beamforming Applications," IEEE MTT-S Digest, 2003, pp. 1677-1680.

Parsa A., et al., "A New Transceiver Architecture for the 60-GHz Band", IEEE Journal of Solid-State Circuits, IEEE Service Center, Piscataway, NJ, USA, vol. 44, No. 3, Mar. 31, 2009, pp. 751-762, XP011252574, ISSN: 0018-9200, DOI: 10.1109/JSSC.2008.2012368 Table IV; figure 11.

Tabesh, et al., "A 65nm CMOS 4-Element Sub-34mW/Element 60GHz Phased-Array Transceiver," 2011 IEEE International Solid-State Circuits Conference Digest of Technical Papers, ISSCC 2011, pp. 166-168.

Tanomura M., et al., "TX and RX Front-Ends for 60GHz Band in 90nm Standard Bulk CMOS", Solid-State Circuits Conference, 2008. ISSCC 2008. Digest of Technical Papers, IEEE International, IEEE, Piscataway, NJ, USA, Feb. 3, 2008, pp. 558-635, XP031391105, ISBN: 978-1-4244-2010-0, figures 31.1.4, 31.1.7.

* cited by examiner

INTEGRATED CIRCUIT FOR MIXING MILLIMETER-WAVELENGTH SIGNALS

CLAIM OF PRIORITY UNDER 35 U.S.C. §119

The present application for patent claims priority to Provisional Application No. 61/635,101, entitled "INTEGRATED CIRCUIT FOR MIXING MILLIMETER-WAVELENGTH SIGNALS" filed Apr. 18, 2012, and assigned to the assignee hereof and hereby expressly incorporated by reference herein.

TECHNICAL FIELD

The present disclosure relates generally to electronic devices. More specifically, the present disclosure relates to an integrated circuit for mixing millimeter-wavelength signals.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform functions faster, more efficiently or with higher quality are often sought after.

Integrated circuits are one kind of electronic device. As technology has progressed, integrated circuits have decreased in size while increasing in efficiency, speed and functionality. These integrated circuits can be utilized within a variety of devices such as computers, smartphones, automobiles and other devices.

Using integrated circuits in different contexts has presented additional challenges in circuit design. For example, difficulties have arisen in designing and implementing integrated circuits that operate with high-frequency signals. For example, designing an integrated circuit that can operate using high-frequency electromagnetic signals is problematic. As can be observed from this discussion, systems and methods that improve the operation of integrated circuits with high-frequency electromagnetic signals may be beneficial.

SUMMARY

An integrated circuit is described. The integrated circuit includes millimeter-wavelength transceiver circuitry. The millimeter-wavelength transceiver circuitry includes a local oscillator that generates a millimeter-wavelength oscillator signal. The millimeter-wavelength transceiver circuitry also includes mixers coupled to the local oscillator. The mixers are within an area without millimeter-wavelength structures. The mixers convert signals based on the millimeter-wavelength oscillator signal. The millimeter-wavelength oscillator signal may have a frequency of approximately 60 gigahertz (GHz). The integrated circuit may be included in a wireless communication device.

The mixers may convert baseband signals. The mixers may be coupled to the local oscillator without millimeter-wavelength structures. The mixers may be coupled to beamforming circuitry.

The area may not include structures for handling transmission line effects. The area may not include a Wilkinson divider. The area may have a dimension smaller than $$\frac{\lambda}{10},$$

where $\lambda$ is an effective wavelength of the millimeter-wavelength oscillator signal.

The millimeter-wavelength transceiver circuitry may include one or more additional sets of mixers. Each additional set of mixers may be within a separate area without millimeter-wavelength structures.

A method for mixing millimeter-wavelength signals on an integrated circuit is also described. The method includes generating a millimeter-wavelength oscillator signal on millimeter-wavelength transceiver circuitry. The method also includes providing the millimeter-wavelength oscillator signal to mixers within an area without millimeter-wavelength structures. The method further includes converting signals based on the millimeter-wavelength oscillator signal.

A computer-program product for mixing millimeter-wavelength signals is also described. The computer-program product includes a non-transitory tangible computer-readable medium with instructions. The instructions include code for causing an integrated circuit to generate a millimeter-wavelength oscillator signal on millimeter-wavelength transceiver circuitry. The instructions also include code for causing the integrated circuit to provide the millimeter-wavelength oscillator signal to mixers within an area without millimeter-wavelength structures. The instructions further include code for causing the integrated circuit to convert signals based on the millimeter-wavelength oscillator signal.

An apparatus for mixing millimeter-wavelength signals is also described. The apparatus includes means for generating a millimeter-wavelength oscillator signal on millimeter-wavelength transceiver circuitry. The apparatus also includes means for providing the millimeter-wavelength oscillator signal to means for mixing signals within an area without millimeter-wavelength structures. The apparatus further includes means for converting signals based on the millimeter-wavelength oscillator signal.

DETAILED DESCRIPTION

Figure 1:
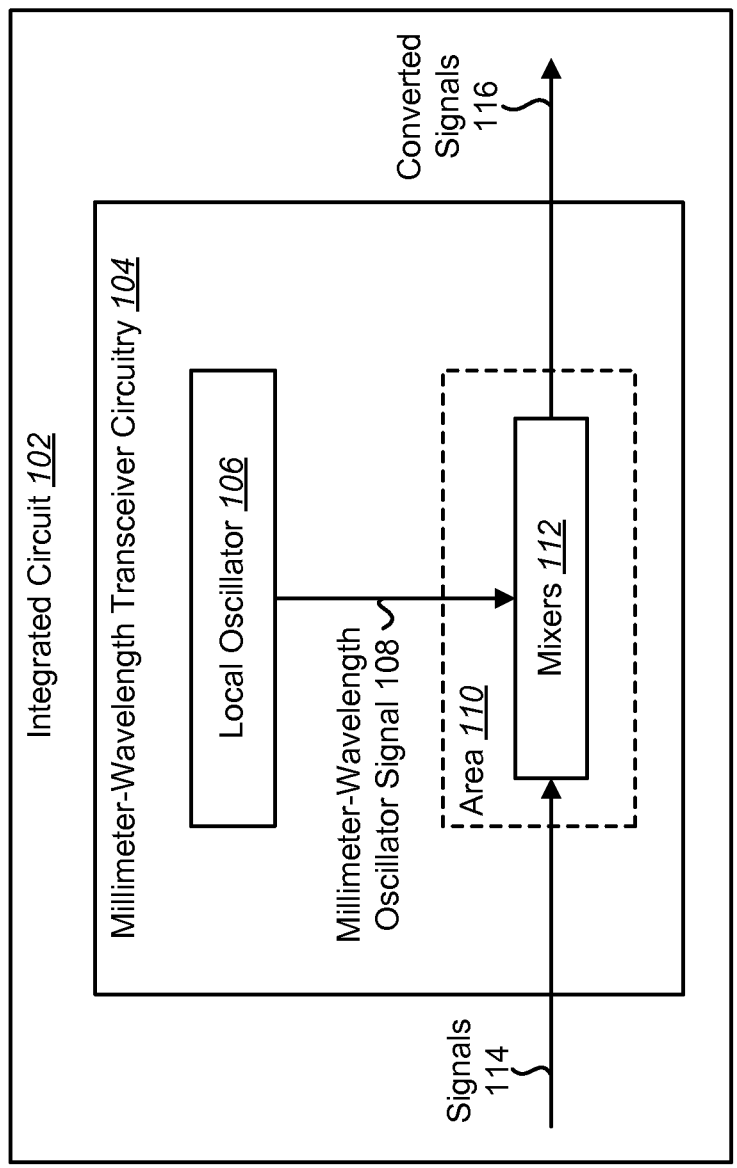
FIG. 1 is a block diagram illustrating one configuration of an integrated circuit for mixing millimeter-wavelength signals.

The systems and methods disclosed herein may be applied to a variety of electronic devices. Examples of electronic devices include voice recorders, video cameras, audio players (e.g., Moving Picture Experts Group-1 (MPEG-1) or MPEG-2 Audio Layer 3 (MP3) players), video players, audio recorders, desktop computers, laptop computers, personal digital assistants (PDAs), gaming systems, etc. One kind of electronic device is a communication device, which may communicate with another device. Examples of communication devices include telephones, laptop computers, desktop computers, cellular phones, smartphones, wireless or wired modems, e-readers, tablet devices, gaming systems, cellular telephone base stations or nodes, access points, wireless gateways and wireless routers.

An electronic device or communication device may operate in accordance with certain industry standards, such as International Telecommunication Union (ITU) standards and/or Institute of Electrical and Electronics Engineers (IEEE) standards (e.g., Wireless Fidelity or "Wi-Fi" standards such as 802.11a, 802.11b, 802.11g, 802.11n and/or 802.11ac). Other examples of standards that a communication device may comply with include IEEE 802.16 (e.g., Worldwide Interoperability for Microwave Access or "WiMAX"), Third Generation Partnership Project (3GPP), 3GPP Long Term Evolution (LTE), Global System for Mobile Telecommunications (GSM) and others (where a communication device may be referred to as a User Equipment (UE), Node B, evolved Node B (eNB), mobile device, mobile station, subscriber station, remote station, access terminal, mobile terminal, terminal, user terminal, subscriber unit, etc., for example). While some of the systems and methods disclosed herein may be described in terms of one or more standards, this should not limit the scope of the disclosure, as the systems and methods may be applicable to many systems and/or standards.

It should be noted that some communication devices may communicate wirelessly and/or may communicate using a wired connection or link. The systems and methods disclosed herein may be applied to communication devices that communicate wirelessly and/or that communicate using a wired connection or link.

As used herein, the term "couple" may denote a direct connection or an indirect connection. For example, if a first component is coupled to a second component, the first component may be directly connected to the second component or may be indirectly connected to the second component (through a third component, for example).

The systems and methods disclosed herein describe a clustered mixers architecture. The clustered mixers architecture may be applied in millimeter wave applications. For example, the systems and methods disclosed herein may be utilized for beamforming for millimeter wave applications. For instance, a 60 gigahertz (GHz) transceiver may be implemented based on the systems and methods disclosed herein. As used herein, the term "millimeter wave" and variations thereof (e.g., millimeter-wavelength) may refer to an electromagnetic signal with a wavelength of 0 to 10 millimeters (mm) (that oscillates in a frequency range of approximately 30 GHz to 300 GHz, for example). Examples of millimeter-wavelength signals include a 30 GHz signal with a wavelength of approximately 5 mm, a 60 GHz signal with a wavelength of approximately 2.5 mm and a 300 GHz signal with a wavelength of approximately 0.5 mm.

When applying millimeter wave signals to integrated circuitry, transmission line effects may cause problems if the circuit size is close to the wavelength of the signals. Known approaches for mitigating transmission line effects include adding millimeter wave structures to the integrated circuitry. Wilkinson dividers are one example of known millimeter wave structures that are used to mitigate transmission line effects. In some known approaches, branch circuits (implemented with Wilkinson dividers (for millimeter applications) or clock buffers (for low GHz applications), for example) may be used to distribute a clock signal from a voltage-controlled oscillator (VCO). It should be noted, however, that the systems and methods disclosed herein do not require branch circuitry. This is because mixers may be clustered such that multiple mixers may be driven from one clock driver in accordance with the systems and methods disclosed herein, for example.

In one implementation of a 4×4 60 GHz transceiver using known approaches, a local oscillator (LO) and distribution circuitry occupies more than half of the circuit area, approximately. In this implementation, for example, the local oscillator and distribution circuitry occupies approximately 50% of the total chip area, a phase-locked loop (PLL) occupies approximately 5% of the total chip area, receive (RX) circuitry occupies approximately 25% of the total chip area and transmit (TX) circuitry occupies approximately 20% of the total chip area. Continuing with the example, the local oscillator and distribution circuitry may be relatively power hungry. For instance, the local oscillator may consume approximately 24.7 milliamps (mA) for receive or transmit mode. Furthermore, each local oscillator buffer consumes approximately 2.33 mA with a power gain of 7 decibels (dB), each voltage-controlled oscillator (VCO) buffer consumes approximately 3 mA while delivering −1.8 decibels with reference to 1 milliwatt (mW) (dBm) into a 50 Ohm load and each Wilkinson divider or In-Phase/Quadrature (IQ) hybrid has a 3.4 dB attenuation. In contrast with this example, the systems and methods disclosed herein may allow the removal of the Wilkinson dividers. This may allow a local oscillator buffer design to be relaxed with a power gain of approximately 0.2 dB.

The systems and methods disclosed herein may be applied to a communication device that uses beamforming. For example, the system and methods disclosed herein may be applied to one example of an architecture as described hereafter. In this example, a homodyne architecture may be used. This may eliminate a problem of interferers or blockers at 60 GHz such that radio frequency (RF) band pass filter design is not required. For instance, a heterodyne architecture may be useful attempting to relax band pass filter design by assigning it on an intermediate frequency (IF), but this example architecture does not need the band pass filter. Accordingly, a homodyne architecture may be used, because of its simplicity and low power consumption.

In this example, a single carrier architecture may also be used. For instance, a single carrier approach can replace orthogonal frequency-division multiplexing (OFDM) for 60 GHz non-line of sight (NLOS), since a smart beamforming algorithm for a single carrier approach may avoid multi path fading issues. Furthermore, a single carrier approach may reduce phase noise requirements and power amplifier (PA) design requirements.

As described above, a beamforming approach may also be applied in this example. A phase rotator and a variable gain amplifier (VGA) may become much easier to design at baseband rather than at 60 GHz. It has been demonstrated that beamforming is a power efficient approach, especially for mobile applications. Accordingly, the systems and methods disclosed herein may be applied in conjunction with beamforming. However, there are potential problems that may arise when using beamforming. For example, a beam dependent residual side band (RSB) may occur with beamforming. For example, if a radio frequency tone is at 61 GHz and a local oscillator tone is at 60 GHz, then an unwanted RSB tone may appear at 59 GHz. Furthermore, there may be 60 GHz local oscillator distribution issues with beamforming in terms of power and area.

In some configurations, the systems and methods disclosed herein may be applied to devices designed to comply with IEEE 802.11ad. For example, IEEE 802.11ad may specify four wireless channels with center frequencies of approximately 58.32 GHz, 60.48 GHz, 62.64 GHz and 64.80 GHz, with a spacing of approximately 2160 megahertz (MHz).

Some configurations of the systems and methods disclosed herein may use a clustered mixers architecture for beamforming for millimeter-wavelength applications. For example, eight pairs of mixers may be clustered within an area of an integrated circuit. By clustering the mixers, millimeter-wave structures may not be needed. This may save circuit area and reduce power consumption (versus the example using known approaches described previously, for instance). According to a known approach, eight pairs of clock signals may separately drive eight pairs of mixers so that eight pairs of clock signals are generated from one clock signal source by millimeter-wave structures. In accordance with the systems and methods disclosed herein, however, one pair of clock signals may directly drive eight pairs of clustered mixers without millimeter-wave structures.

In other configurations of the systems and methods disclosed herein, a clock signal may be provided from a voltage controlled oscillator/phase-locked loop (VCO/PLL) to four clusters of mixers. The clock signal may be multiplied in frequency to provide separate local oscillator signals to each cluster of mixers. Each cluster of mixers does not use millimeter-wave structures, thus saving area and reducing power consumption. This approach may allow scalability. According to a known approach, four pairs of clock signals have to separately drive four pairs of mixers so that four pairs of clock signals are generated from one clock signal source by millimeter-wave structures. In accordance with the systems and methods disclosed herein, however, one pair of clock signals can directly drive four pairs of clustered mixers without millimeter-wave structures.

Various configurations are now described with reference to the Figures, where like element numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of an integrated circuit 102 for mixing millimeter-wavelength signals. The integrated circuit 102 includes millimeter-wavelength transceiver circuitry 104. The millimeter-wavelength transceiver circuitry 104 includes a local oscillator 106. The local oscillator 106 may produce a millimeter-wavelength oscillator signal 108. The millimeter-wavelength oscillator signal 108 may have a wavelength within the range of 0 to 10 mm or may oscillate in a frequency range of 30 GHz to 300 GHz, for example. In some configurations, for instance, the millimeter-wavelength oscillator signal 108 may oscillate at approximately 60 GHz. The local oscillator 106 is coupled to mixers 112 and provides the millimeter-wavelength oscillator signal 108 to the mixers 112. In some configurations, the local oscillator 106 may be coupled to the mixers 112 without any millimeter-wavelength structures (e.g., Wilkinson dividers, structures used to handle transmission line effects, etc.). For example, no millimeter-wavelength structures may be coupled in the path between the local oscillator 106 and the mixers 112.

The mixers 112 are included within an area 110 of the millimeter-wavelength transceiver circuitry 104. The area 110 may not include any millimeter-wavelength structures. Examples of millimeter wavelength structures include Wilkinson dividers and/or other structures use to handle (e.g., mitigate, reduce, avoid, etc.) transmission line effects for millimeter-wavelength signals. In some configurations, the area 110 may have one or more dimensions (e.g., width and/or length) less than or equal to $$\frac{\lambda}{10},$$

where λ is an effective wavelength of the millimeter-wavelength oscillator signal 108.

The mixers 112 may convert the signals 114 to converted signals 116. For example, the mixers 112 may mix the millimeter-wavelength oscillator signal 108 with the signals to produce converted signals 116. In some configurations, the signals 114 may be baseband signals that the mixers 112 upconvert to converted signals 116 (e.g., radio frequency (RF) signals). Additionally or alternatively, the signals 114 may be RF signals that the mixers 112 downconvert to converted signals 116 (e.g., baseband signals).

Figure 2:
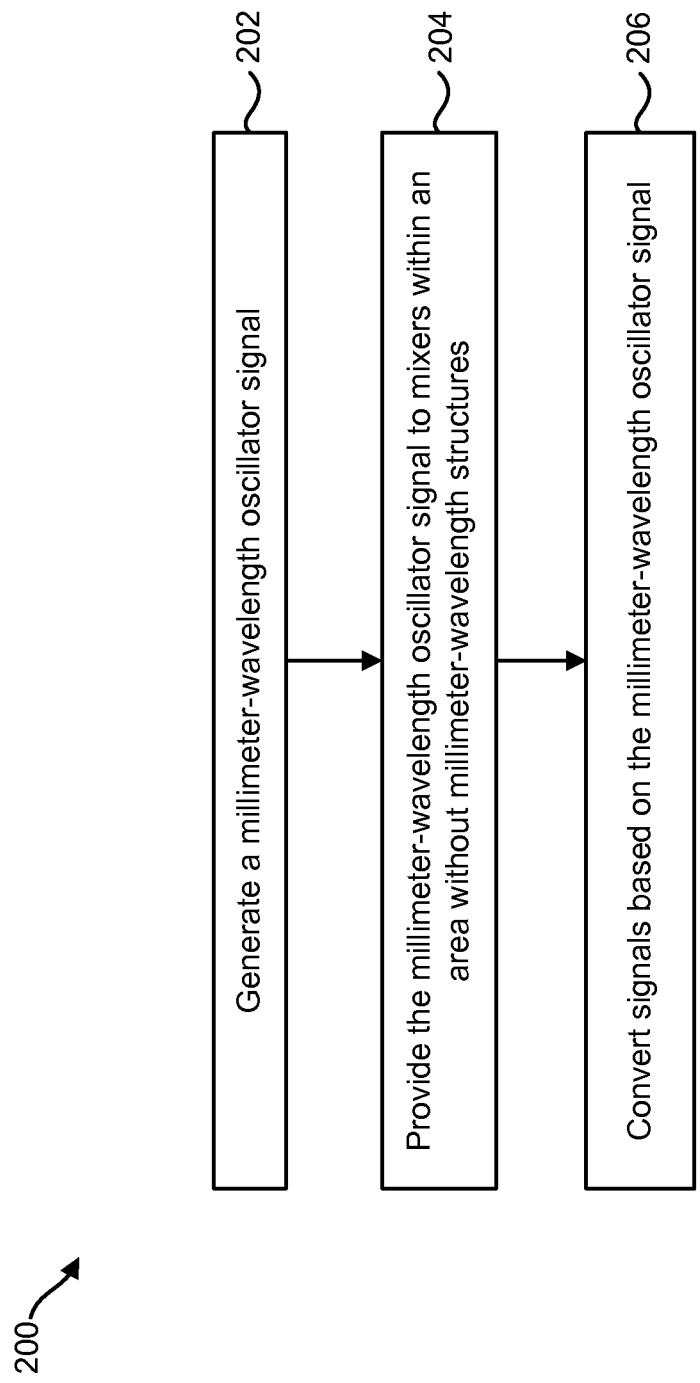
FIG. 2 is a flow diagram illustrating one configuration of a method for mixing millimeter-wavelength signals.

FIG. 2 is a flow diagram illustrating one configuration of a method 200 for mixing millimeter-wavelength signals. An integrated circuit 102 may generate 202 a millimeter-wavelength oscillator signal 108. For example, a local oscillator 106 included in the integrated circuit 102 may generate 202 the millimeter-wavelength oscillator signal 108. The millimeter-wavelength oscillator signal 108 may be generated 202 based on an oscillator signal from a phase-locked loop (PLL) and/or voltage controlled oscillator (VCO). It should be noted that a voltage controlled oscillator (VCO) may provide a signal that varies in frequency.

The integrated circuit 102 may provide 204 the millimeter-wavelength oscillator signal 108 to mixers 112 within an area 110 without millimeter-wavelength structures. For example, the millimeter-wavelength oscillator signal 108 may be provided 204 to the mixers 112 within the area 110 as described above in connection with FIG. 1.

The integrated circuit 102 may convert 206 signals 114 based on the millimeter-wavelength oscillator signal 108. For example, the integrated circuit 102 may convert 206 the signals 114 using the mixers 112 to produce converted signals 116 (e.g., upconverted signals and/or downconverted signals).

Figure 3:
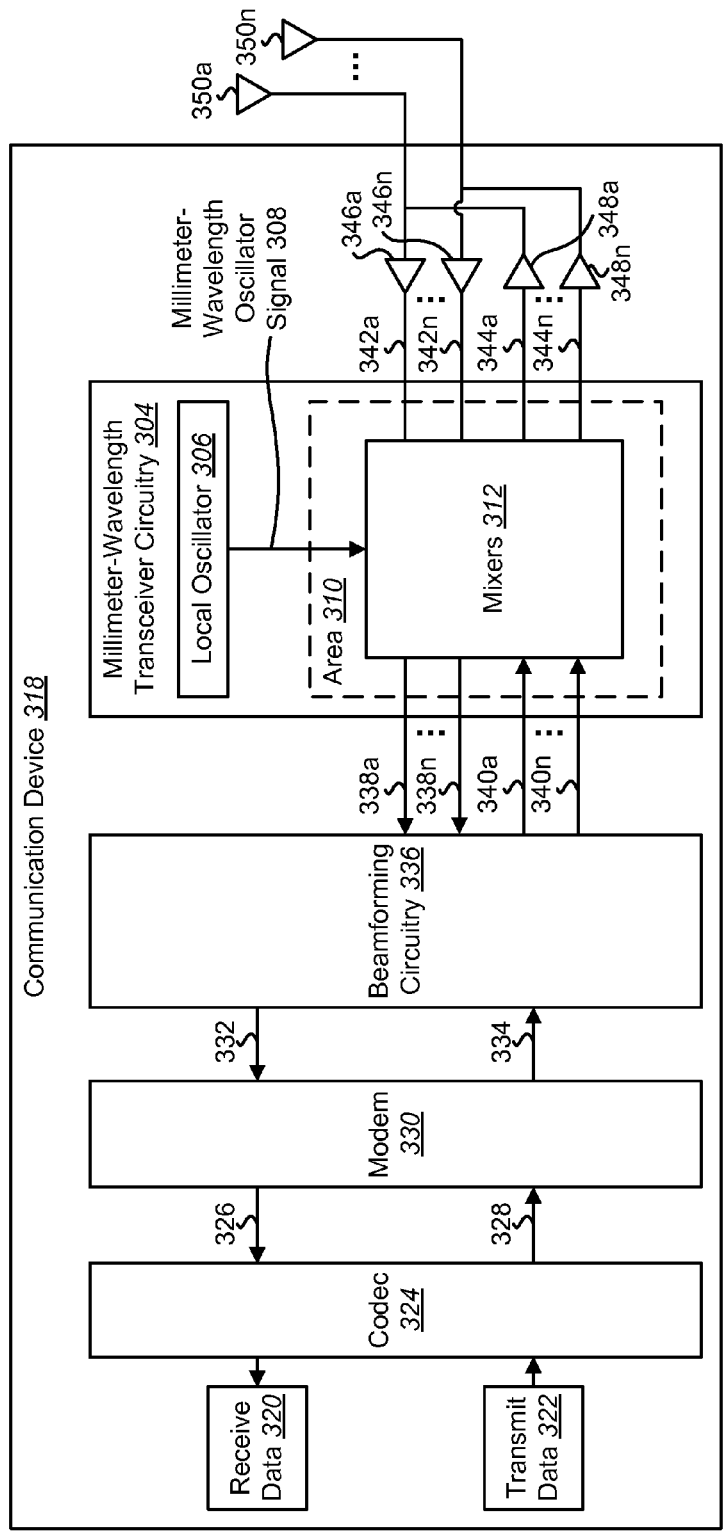
FIG. 3 is a block diagram illustrating one configuration of a communication device in which systems and methods for mixing millimeter-wavelength signals may be implemented.

FIG. 3 is a block diagram illustrating one configuration of a communication device 318 in which systems and methods for mixing millimeter-wavelength signals may be implemented. Examples of the communication device 318 include access points, access terminals, base stations, wireless communication devices, etc. For instance, specific examples of the communication device 318 include wireless routers, laptop computers, wireless gateways, desktop computers, cellular phones, smartphones, gaming devices, network cards, tablet devices, personal digital assistants (PDAs), music players, portable computing devices, etc. The communication device 318 may include a codec 324 (e.g., coder/decoder), a modem 330 (e.g., modulator/demodulator), beamforming circuitry 336, millimeter-wavelength transceiver circuitry 304, one or more receive amplifiers 346a-n and/or one or more transmit amplifiers 348a-n.

The communication device 318 may also include an integrated circuit. The integrated circuit included in the communication device 318 may be an example of the integrated circuit 102 described in connection with FIG. 1. The integrated circuit included in the communication device 318 may include one or more of the millimeter-wavelength transceiver circuitry 304, the beamforming circuitry 336, the modem 330 and the codec 324. For example, the integrated circuit may include only the millimeter-wavelength transceiver circuitry 304 in some configurations. In other configurations, the integrated circuit may include the one or more receive amplifiers 346a-n, the one or more transmit amplifiers 348a-n, the beamforming circuitry 336, the modem 330 and/or the codec 324 in addition to the millimeter-wavelength transceiver circuitry 304.

The millimeter-wavelength transceiver circuitry 304 includes a local oscillator 306. The local oscillator 306 may produce a millimeter-wavelength oscillator signal 308. In some configurations, the millimeter-wavelength oscillator signal 308 may oscillate at approximately 60 GHz. The local oscillator 306 is coupled to mixers 312 and provides the millimeter-wavelength oscillator signal 308 to the mixers 312. In some configurations, the local oscillator 306 may be coupled to the mixers 312 without any millimeter-wavelength structures (e.g., Wilkinson dividers, structures used to handle transmission line effects, etc.). For example, no millimeter-wavelength structures may be coupled in the path between the local oscillator 306 and the mixers 312.

The mixers 312 are included within an area 310 of the millimeter-wavelength transceiver circuitry 304. The area 310 may not include any millimeter-wavelength structures. In some configurations, the area 310 may have one or more dimensions as described above in connection with FIG. 1.

The communication device 318 may include transmit data 322. The transmit data 322 may be data or information for transmission (to another communication device, for example). The transmit data 322 may be provided to the codec 324. The codec 324 may code the transmit data 322 to produce a coded signal 328. For example, the codec 324 may code the transmit data 322 into a particular format and/or may add error detection/correction coding (e.g., cyclic redundancy check coding, etc.). The coded signal 328 is provided to the modem 330. The modem 330 may modulate the coded signal 328 to produce a modulated signal 334. For example, the modem 330 may modulate the coded signal 328 based on a modulation scheme (e.g., quadrature amplitude modulation (QAM), binary phase shift keying (BPSK), etc.).

The modulated signal 334 may be provided to the beamforming circuitry 336 to produce beamformed signals 340a-n. For example, the beamforming circuitry 336 may adjust the phase and/or amplitude characteristics of the modulated signal 334 such that signals transmitted from the communication device 318 are formed into one or more beams in one or more spatial directions. In some configurations, the modulated signal 334 may be duplicated and the phase and/or amplitude characteristics of one or more of the resulting signals may be adjusted to produce the one or more beamformed signals 340a-n. In other configurations, the modulated signal 334 may be divided into distinct signals and the phase and/or amplitude characteristics of one or more of the resulting signals may be adjusted to produce the one or more beamformed signals 340a-n. In some configurations, for instance, the beamforming circuitry 336 may apply a precoding matrix to the modulated signal 334 to produce the beamformed signals 340a-n. It should be noted that in some configurations, the beamforming circuitry 336 may include multiple separate circuitries/modules (for in-phase and quadrature signals, for example).

The beamformed signals 340a-n may be provided to the millimeter-wavelength transceiver circuitry 304. In particular, the beamformed signals 340a-n are provided to the mixers 312. The mixers 312 may convert the beamformed signals 340a-n to upconverted signals 344a-n. It should be noted that the beamformed signals 340a-n may be examples of the signals 114 described in connection with FIG. 1. Additionally, the upconverted signals 344a-n may be examples of the converted signals 116 described in connection with FIG. 1. The mixers 312 may mix the millimeter-wavelength oscillator signal 308 with the beamformed signals 340a-n to produce the upconverted signals 344a-n. For instance, the beamformed signals 340a-n may be baseband signals that the mixers 312 upconvert to upconverted signals 344a-n (e.g., radio frequency (RF) signals).

The upconverted signals 344a-n may be provided to transmit amplifiers 348a-n. The transmit amplifiers 348a-n may amplify the upconverted signals 344a-n, which are provided to the antennas 350a-n for transmission. For example, the transmit amplifiers 348a-n may be power amplifiers that increase the magnitude of the upconverted signals 344a-n for transmission by the antennas 350a-n.

The antennas 350a-n may also receive signals. For example, the antennas 350a-n may receive RF signals. The received signals may be provided to the receive amplifiers 346a-n to produce amplified received signals 342a-n. Examples of the receive amplifiers 346a-n include low noise amplifiers (LNAs). The amplified received signals 342a-n may be provided to the millimeter-wavelength transceiver circuitry 304. In particular, the amplified received signals 342a-n are provided to the mixers 312. The mixers 312 may convert the amplified received signals 342a-n to downconverted signals 338a-n. It should be noted that the amplified received signals 342a-n may be examples of the signals 114 described in connection with FIG. 1. Additionally, the downconverted signals 338a-n may be examples of the converted signals 116 described in connection with FIG. 1. The mixers 312 may mix the millimeter-wavelength oscillator signal 308 with the amplified received signals 342a-n to produce the downconverted signals 338a-n. For instance, the amplified received signals 342a-n may be RF signals that the mixers 312 downconvert to downconverted signals 338a-n (e.g., baseband signals).

The downconverted signals 338a-n may be provided to the beamforming circuitry 336. The beamforming circuitry 336 may produce a detected signal 332 based on the downconverted signals 338a-n. For example, the beamforming circuitry 336 may detect, filter and/or combine the downconverted signals 338a-n. For instance, the beamforming circuitry 336 may adjust the phase and/or amplitude characteristics of one or more of the amplified received signals 338a-n and/or may combine one or more amplified received signals 338a-n in order to improve received signal quality. Additionally or alternatively, the beamforming circuitry 336 may adjust the phase and/or amplitude characteristics of one or more of the amplified received signals 338a-n in order to reject noise (e.g., unwanted signals).

The detected signal 332 may be provided to the modem 330. The modem 330 may demodulate the detected signal 332 to produce a demodulated signal 326. For example, the modem 330 may demodulate the detected signal 332 in accordance with a modulation scheme used to modulate the signal (by another communication device).

The demodulated signal 326 may be provided to the codec 324. The codec 324 may decode the demodulated signal 326 to produce receive data 320. For example, the codec 324 may decode the demodulated signal 326 in accordance with a coding scheme used to code the signal (by another communication device). The receive data 320 may be data or information received from another communication device.

It should be noted that one or more the components illustrated as included within the communication device 318 may be rearranged or omitted in other configurations. For example, the millimeter-wavelength transceiver circuitry 304 may be coupled in-between the modem 330 and the beamforming circuitry 336 in other configurations. In yet other configurations, the beamforming circuitry 336 may be omitted. Thus, for instance, the millimeter-wavelength transceiver circuitry 304 may be implemented in the communication device 318 in any manner appropriate for an upconverter/downconverter.

Figure 4:
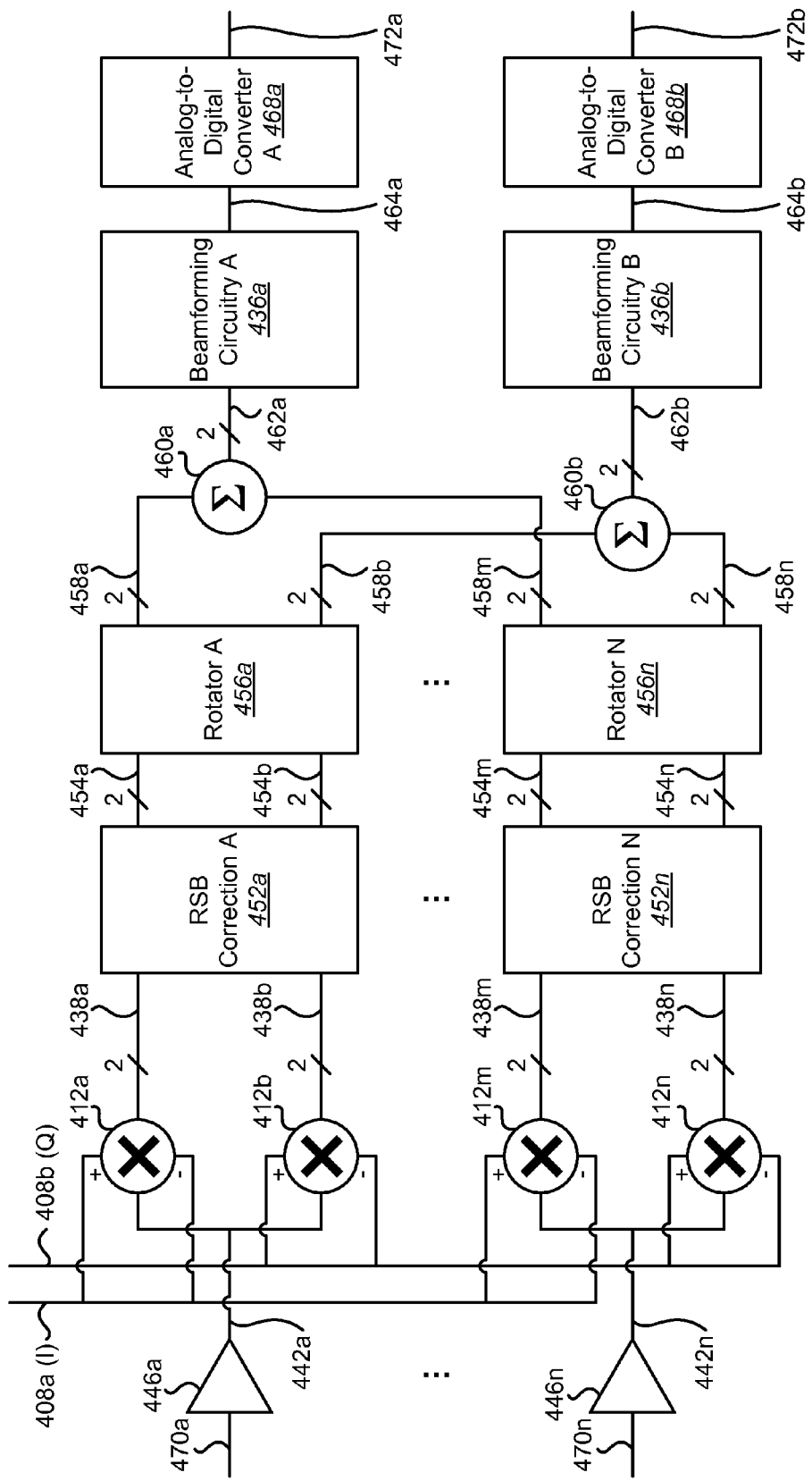
FIG. 4 is a block diagram illustrating one example of a receive chain that may be implemented in accordance with the systems and methods disclosed herein.

FIG. 4 is a block diagram illustrating one example of a receive chain that may be implemented in accordance with the systems and methods disclosed herein. For example, one or more of the elements illustrated in FIG. 4 may be included in or coupled to the millimeter-wavelength transceiver circuitry (e.g., millimeter-wavelength transceiver circuitry 104). In this example, received signals 470a-n (from antennas, for example) may be provided to receive amplifiers 446a-n to produce amplified received signals 442a-n. Examples of the receive amplifiers 446a-n include low noise amplifiers (LNAs). The amplified received signals 442a-n are provided to mixers 412a-n. It should be noted that the mixers 412a-n may be included in millimeter-wavelength transceiver circuitry.

The mixers 412a-n may convert the amplified received signals 442a-n to downconverted signals 438a-n. It should be noted that the amplified received signals 442a-n may be examples of the signals 114 described in connection with FIG. 1. Additionally, the downconverted signals 438a-n may be examples of the converted signals 116 described in connection with FIG. 1. The mixers 412 may mix millimeter-wavelength oscillator signals 408a-b with the amplified received signals 442a-n to produce the downconverted signals 438a-n. For instance, the amplified received signals 442a-n may be RF signals that the mixers 412 downconvert to downconverted signals 438a-n (e.g., baseband signals).

In the example illustrated in FIG. 4, the millimeter-wavelength oscillator signals 408a-b include an in-phase millimeter-wavelength oscillator signal 408a and a quadrature millimeter-wavelength oscillator signal 408b. The in-phase millimeter-wavelength oscillator signal 408a and the quadrature millimeter-wavelength oscillator signal 408b may have a phase difference of approximately 90 degrees.

As illustrated in FIG. 4, the mixers 412a-n mix or multiply the amplified received signals 442a-n by positive and negative (e.g., inverted) versions of the in-phase millimeter-wavelength oscillator signal 408a and the quadrature millimeter-wavelength oscillator signal 408b. This results in downconverted signals 438a-n in differential pairs. For example, a first mixer 412a may mix a first amplified received signal 442a with positive and negative (e.g., inverted) versions of the in-phase millimeter-wavelength oscillator signal 408a to produce a first in-phase downconverted signal 438a that includes a positive first in-phase downconverted signal and a negative (e.g., inverted) first in-phase downconverted signal pair. Additionally, a second mixer 412b may mix a first amplified received signal 442a with positive and negative (e.g., inverted) versions of the quadrature millimeter-wavelength oscillator signal 408b to produce a first quadrature downconverted signal 438b that includes a positive first quadrature downconverted signal and a negative (e.g., inverted) first quadrature downconverted signal pair. As illustrated in FIG. 4, differential (signal) pairs may be denoted with a "2" and a "/" through a signal line.

The downconverted signals 438a-n may be provided to RSB correction modules A-N 452a-n. It should be noted that the term "module" as used herein may mean that an element may be implemented in hardware (e.g., circuitry), software or a combination of both. The RSB correction modules 452a-n (in a receiver, for instance) may perform RSB suppression after downconverting a radio frequency signal to a baseband signal, for example. The RSB correction modules 452a-n may generate corrected signals 454a-n based on the downconverted signals 438a-n. For example, RSB correction module A 452a may produce a first in-phase corrected signal 454a differential pair and a first quadrature corrected signal 454b differential pair.

The corrected signals 454a-n may be provided to rotators 456a-n. The rotators 456a-n may rotate the phase of the corrected signals 454a-n to produce rotated signals 458a-n. For example, rotator A 456a may rotate the first in-phase corrected signal 454a differential pair and the first quadrature corrected signal 454b differential pair to respectively produce a first in-phase rotated signal 458a differential pair and a first quadrature rotated signal 458b differential pair.

The rotated signals 458a-n may be provided to summers 460a-b. A first summer 460a may combine or sum the in-phase rotated signals (e.g., in-phase rotated signals 458a, 458m) from each rotator 456a-n to produce a combined in-phase signal 462a. A second summer 460b may combine or sum the quadrature rotated signals (e.g., quadrature rotated signals 458b, 458n) from each rotator 456a-n to produce a combined quadrature signal 462b.

The combined in-phase signal 462a may be provided to beamforming circuitry A 436a and the combined quadrature signal 462b may be provided to beamforming circuitry B 436b. Beamforming circuitry A 436a and beamforming circuitry B 436b may respectively perform operations on the combined in-phase signal 462a and the combined quadrature signal 462b similar to the operations described above in connection with the beamforming circuitry 336 illustrated in FIG. 3. Beamforming circuitry A 436a may produce an in-phase analog signal 464a and beamforming circuitry B 436b may produce a quadrature analog signal 464b.

The analog signals 464a-b may be provided to analog-to-digital converters 468a-b (ADCs). The analog-to-digital converters 468a-b may respectively convert the in-phase analog signal 464a and the quadrature analog signal 464b to a digital in-phase signal 472a and a digital quadrature signal 472b. In some configurations, the digital signals 472a-b may be provided to a modem (e.g., a modem 330).

Figure 5:
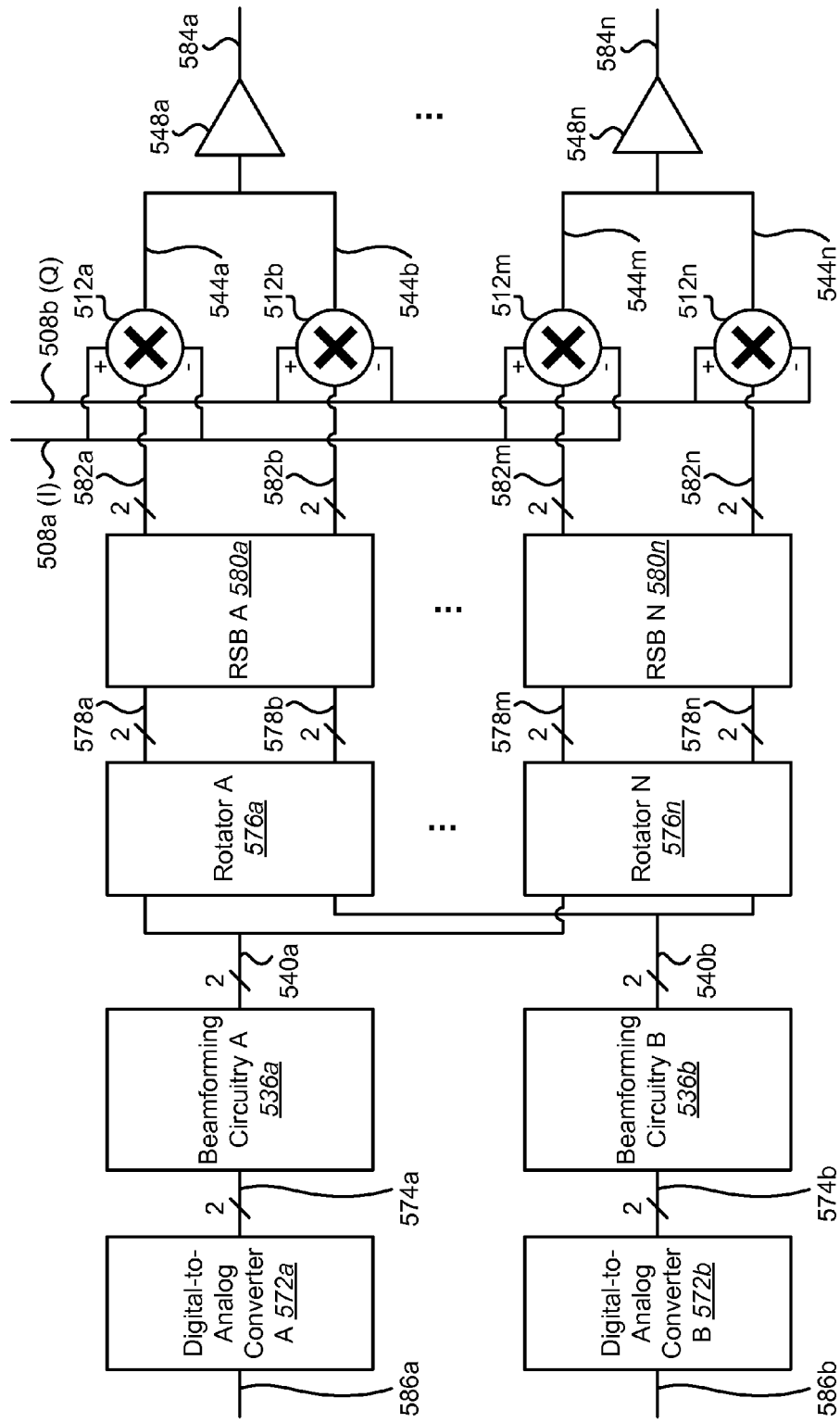
FIG. 5 is a block diagram illustrating one example of a transmit chain that may be implemented in accordance with the systems and methods disclosed herein.

FIG. 5 is a block diagram illustrating one example of a transmit chain that may be implemented in accordance with the systems and methods disclosed herein. For example, one or more of the elements illustrated in FIG. 5 may be included in or coupled to the millimeter-wavelength transceiver circuitry (e.g., millimeter-wavelength transceiver circuitry 104). Digital signals 586a-b may be respectively provided to digital-to-analog converters 572a-b (DACs). The digital-to-analog converters 572a-b may respectively convert the digital signals 586a-b to analog signals 574a-b. It should be noted that the analog signals 574a-b may be differential pairs. As illustrated in FIG. 5, differential (signal) pairs may be denoted with a "2" and a "/" through a signal line.

The analog signals 574a-b may be respectively provided to beamforming circuitry A 536a and beamforming circuitry B 536b. Beamforming circuitry A 536a and beamforming circuitry B 536b may respectively perform operations on the analog signals 574a-b similar to the operations described above in connection with the beamforming circuitry 336 illustrated in FIG. 3. Beamforming circuitry A 536a may produce a first beamformed signal 540a and beamforming circuitry B 536b may produce a second beamformed signal 540b. The first beamformed signal 540a may be a differential pair and the second beamformed signal 540b may be a differential pair.

The first beamformed signal 540a may be provided to rotators 576a-n. The second beamformed signal 540b may also be provided to the rotators 576a-n. The rotators 576a-n may rotate the phase of the beamformed signals 540a-b to produce rotated signals 578a-n. For example, rotator A 576a may rotate the first beamformed signal 540a differential pair and the second beamformed signal 540b differential pair to produce a rotated signal 578a-b differential pairs.

The rotated signals 578a-n may be provided to RSB modules A-N 580a-n. The RSB modules 580a-n (in a transmitter, for instance) may perform RSB suppression before transmitting a radio frequency signal through power amplifier(s), for example. The RSB modules 580a-n may generate signals 582a-n based on the rotated signals 578a-n. For example, RSB module A 580a may produce signal 582a-b differential pairs. The signals 582a-n may be provided to mixers 512a-n. It should be noted that the mixers 512a-n may be included in millimeter-wavelength transceiver circuitry.

The mixers 512a-n may convert the signals 582a-n to upconverted signals 544a-n. It should be noted that the signals 582a-n may be examples of the signals 114 described in connection with FIG. 1. Additionally, the upconverted signals 544a-n may be examples of the converted signals 116 described in connection with FIG. 1. The mixers 512 may mix millimeter-wavelength oscillator signals 508a-b with the signals 582a-n to produce the upconverted signals 544a-n. For instance, the signals 582a-n may be baseband signals that the mixers 512 upconvert to upconverted signals 544a-n (e.g., RF signals).

In the example illustrated in FIG. 5, the millimeter-wavelength oscillator signals 508a-b include an in-phase millimeter-wavelength oscillator signal 508a and a quadrature millimeter-wavelength oscillator signal 508b. The in-phase millimeter-wavelength oscillator signal 508a and the quadrature millimeter-wavelength oscillator signal 508b may have a phase difference of approximately 90 degrees.

As illustrated in FIG. 5, the mixers 512a-n mix or multiply the signals 582a-n by positive and negative (e.g., inverted) versions of the in-phase millimeter-wavelength oscillator signal 508a and the quadrature millimeter-wavelength oscillator signal 508b. This results in upconverted signals 544a-n. For example, a first mixer 512a may mix a signal 582a with positive and negative (e.g., inverted) versions of the in-phase millimeter-wavelength oscillator signal 508a to produce a first in-phase upconverted signal 544a. Additionally, a second mixer 512b may mix a signal 582b with positive and negative (e.g., inverted) versions of the quadrature millimeter-wavelength oscillator signal 508b to produce a first quadrature upconverted signal 544b.

In this example, the upconverted signals 544a-n may be provided to transmit amplifiers 548a-n to produce amplified upconverted signals 584a-n. Examples of the transmit amplifiers 548a-n include power amplifiers (PAs). The amplified upconverted signals 584a-n may be provided to antennas (e.g., antennas 350a-n) for transmission.

It should be noted that as used herein, numeric labels having an alphabetic range do not necessarily imply the same number of elements for corresponding letters. For example, the number of mixers 512a-n may be different from the number of transmit amplifiers 548a-n, even though their alphabetic ranges (e.g., "a-n") are the same. In general, a numeric label with an alphabetic range may denote one or more of the corresponding element.

Figure 6:
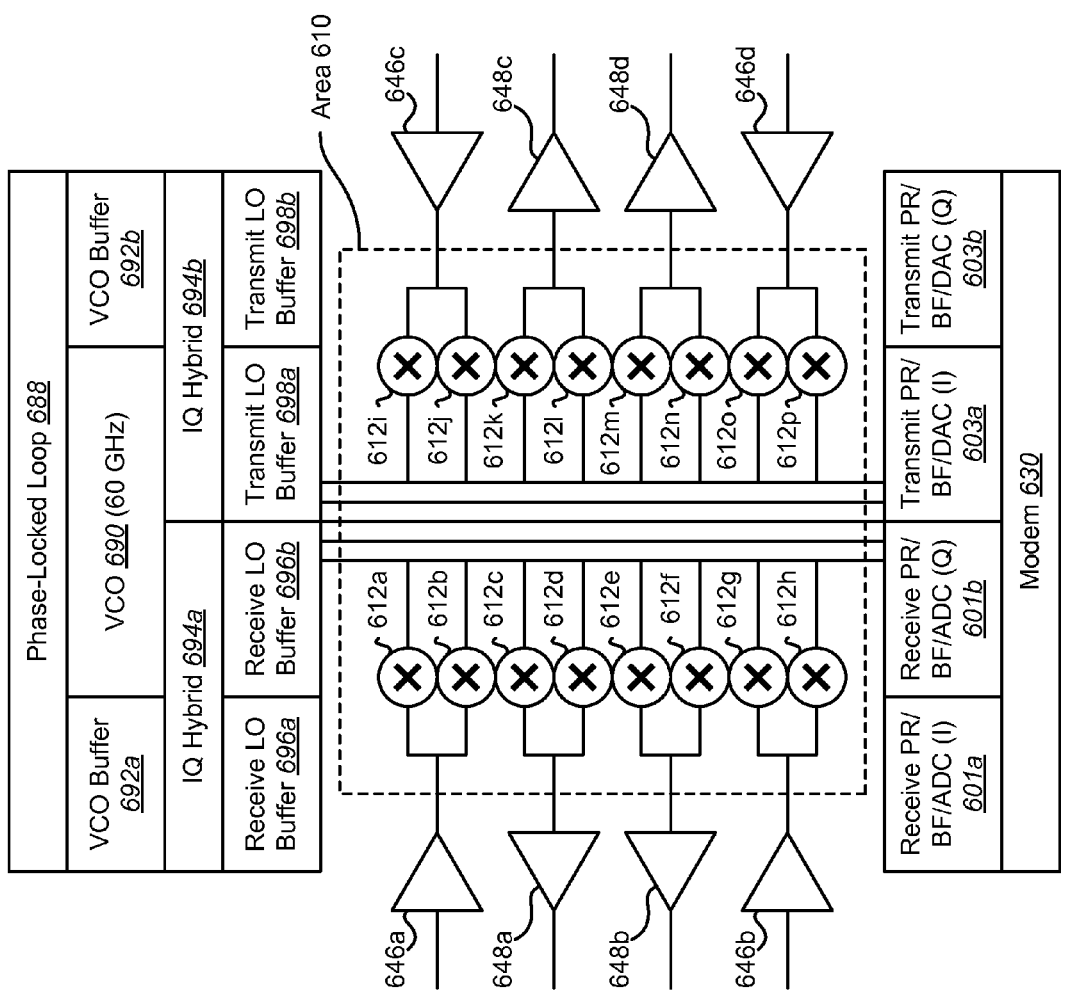
FIG. 6 is a block diagram illustrating one configuration of mixers in accordance with the systems and methods disclosed herein.

FIG. 6 is a block diagram illustrating one configuration of mixers 612a-p in accordance with the systems and methods disclosed herein. For example, one or more of the elements illustrated in FIG. 6 may be included in millimeter-wavelength transceiver circuitry (e.g., millimeter-wavelength transceiver circuitry 104). This configuration may use a clustered mixers 612a-p architecture for beamforming for millimeter-wave applications. For example, eight pairs of mixers 612a-p may be clustered within an area 610 of an integrated circuit. By clustering the mixers 612a-p, millimeter-wave structures may not be needed. This may save circuit area and reduce power consumption. According to a known approach, eight pairs of clock signals may separately drive eight pairs of mixers so that eight pairs of clock signals are generated from one clock signal source by millimeter-wave structures. In accordance with the systems and methods disclosed herein, however, one pair of clock signals may directly drive eight pairs of clustered mixers 612a-p without millimeter-wave structures.

In the configuration illustrated in FIG. 6, a phase-locked loop 688 (PLL) may drive a voltage controlled oscillator 690 (VCO). In one configuration, the VCO 690 may provide an oscillating signal at approximately 60 GHz. The VCO 690 may provide the oscillating signal (e.g., clock signal) to a first VCO buffer 692a and to a second VCO buffer 692b. The VCO buffers 692a-b may respectively drive In-Phase/Quadrature (IQ) hybrid circuits 694a-b. A first IQ hybrid circuit 694a provides in-phase and quadrature (clock) signals to receive local oscillator (LO) buffers 696a-b. A second IQ hybrid circuit 694b provides in-phase and quadrature (clock) signals to transmit local oscillator (LO) buffers 698a-b. The LO buffers 696a-b, 698a-b may be examples of the local oscillator 106 described in connection with FIG. 1.

The first receive LO buffer 696a may provide an in-phase millimeter-wavelength oscillator signal to mixers 612a, 612g, 612i, 612o for (in-phase) downconversion of amplified received signals provided by receive amplifiers 646a-d (LNAs). Additionally, the second receive LO buffer 696b may provide a quadrature millimeter-wavelength oscillator signal to mixers 612b, 612h, 612j, 612p for (quadrature) downconversion of amplified received signals provided by the receive amplifiers 646a-d (LNAs).

The first transmit LO buffer 698a may provide an in-phase millimeter-wavelength oscillator signal to mixers 612c, 612e, 612k, 612m for (in-phase) upconversion of signals for transmission provided to transmit amplifiers 648a-d (PAs). Additionally, the second transmit LO buffer 698b may provide a quadrature millimeter-wavelength oscillator signal to mixers 612d, 612f, 612l, 612n for (quadrature) upconversion of signals for transmission provided to the transmit amplifiers 648a-d (PAs).

In some configurations, pairs of transmit amplifiers 648a-d and receive amplifiers 646a-d may be coupled to antennas (e.g., antennas 350). For example, the first receive amplifier 646a and the first transmit amplifier 648a may be coupled to a first antenna. Additionally, the second receive amplifier 646b and the second transmit amplifier 648b may be coupled to a second antenna. Additionally, the third receive amplifier 646c and the third transmit amplifier 648c may be coupled to a third antenna. Additionally, the fourth receive amplifier 646d and the fourth transmit amplifier 648d may be coupled to a fourth antenna.

Downconverted (in-phase) signals from mixers 612a, 612g, 612i, 612o (coupled to receive amplifiers 646a-d) may be provided to a first receive phase rotator (PR), beamforming (BF) and analog-to-digital converter (ADC) module 601a (PR/BF/ADC 601a). Downconverted (quadrature) signals from mixers 612b, 612h, 612j, 612p (coupled to receive amplifiers 646a-d) may be provided to a second receive phase rotator (PR), beamforming (BF) and analog-to-digital converter (ADC) module 601b (PR/BF/ADC 601b). The PR/BF/ADCs 601a-b may provide functionality similar to and/or be configured similar to the rotators 456a-n, beamforming circuitries 436a-b and analog-to-digital converters 468a-b described in connection with FIG. 4 above. The PR/BF/ADCs 601a-b may perform operations on the downconverted signals and provide the resulting signals to the modem 630.

The modem 630 may provide signals (e.g., modulated signals) to a first transmit phase rotator (PR), beamforming (BF) and digital-to-analog converter (DAC) module 603a (PR/BF/DAC 603a). Additionally, the modem 630 may provide signals (e.g., modulated signals) to a second transmit phase rotator (PR), beamforming (BF) and digital-to-analog converter (DAC) module 603b (PR/BF/DAC 603b). The PR/BF/DACs 603a-b may provide functionality similar to and/or be configured similar to the rotators 576a-n, beamforming circuitries 536a-b and digital-to-analog converters 572a-b described in connection with FIG. 5 above. The PF/BF/DACs 603a-b may perform operations on the signals provided by the modem 630 and provide the resulting signals to mixers 612c-f, 612k-n for upconversion. For example, the first PF/BF/DAC 603a may provide resulting signals to mixers 612c, 612e, 612k, 612m for (in-phase) upconversion. Additionally, the second PF/BF/DAC 603b may provide resulting signals to mixers 612d, 612f, 612l, 612n for (quadrature) upconversion.

Figure 7:
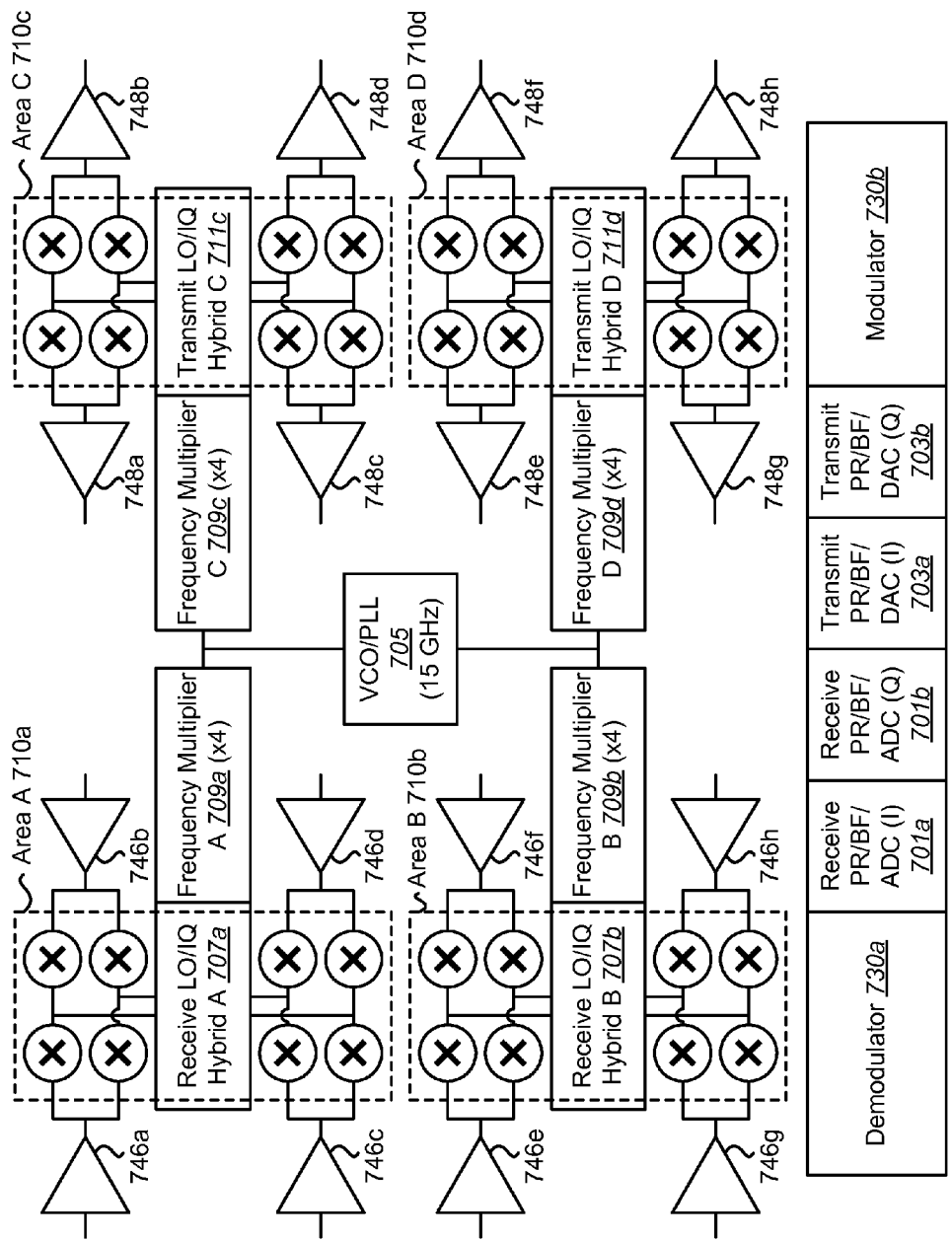
FIG. 7 is a block diagram illustrating another configuration of mixers in accordance with the systems and methods disclosed herein.

FIG. 7 is a block diagram illustrating another configuration of mixers in accordance with the systems and methods disclosed herein. For example, one or more of the elements illustrated in FIG. 7 may be included in millimeter-wavelength transceiver circuitry (e.g., millimeter-wavelength transceiver circuitry 104). In this configuration of the systems and methods disclosed herein, a clock signal may be provided from a voltage controlled oscillator/phase-locked loop (VCO/PLL) 705 to four clusters or sets of mixers in separate areas A-D 710a-d. The clock signal may be multiplied in frequency by frequency multipliers A-D 709a-d to provide separate local oscillator signals to each cluster or set of mixers in areas A-D 710a-d. For example, the VCO/PLL 705 may provide a 15 GHz clock signal to the frequency multipliers 709a-d, which may multiply the frequency of the clock signal by four to generate four clock signals, each having a frequency of approximately 60 GHz. Each cluster or set of mixers in respective areas A-D 710a-d does not use millimeter-wave structures, thus saving area and reducing power consumption. In other words, millimeter-wave structures may not be used in areas A-D 710a-d. This approach may allow scalability. According to a known approach, four pairs of clock signals have to separately drive four pairs of mixers so that four pairs of clock signals are generated from one clock signal source by millimeter-wave structures. In accordance with the systems and methods disclosed herein, however, one pair of clock signals can directly drive four sets of clustered mixers without millimeter-wave structures. For example, each of the areas 710a-d may not include millimeter-wavelength structures. Additionally or alternatively, each set of mixers may be coupled to a local oscillator without millimeter-wavelength structures. It should be noted that a set of mixers may include one or more mixers.

In the configuration illustrated in FIG. 7, the VCO/PLL 705 may provide an oscillating signal (e.g., clock signal) to frequency multipliers A-D 709a-d, which may increase the frequency of the signal (by multiplying it by some factor, for example). The resulting signals may be respectively provided to receive local oscillator (LO) and in-phase/quadrature (IQ) hybrid (receive LO/IQ hybrid) modules A-B 707a-b and to transmit local oscillator (LO) and in-phase/quadrature (IQ) hybrid (transmit LO/IQ hybrid) modules C-D 711c-d. The receive LO/IQ hybrid modules A-B 707a-b may respectively provide in-phase and quadrature millimeter-wavelength oscillator signals to sets of mixers in areas A-B 710a-b. Additionally, the transmit LO/IQ hybrid modules C-D 711c-d may respectively provide in-phase and quadrature millimeter-wavelength oscillator signals to sets of mixers in areas C-D 710c-d. The local oscillators included in the receive LO/IQ hybrid modules 707a-b and the transmit LO/IQ hybrid modules 711c-d may be examples of the local oscillator 106 described in connection with FIG. 1.

The in-phase and quadrature millimeter-wavelength oscillator signals provided by the receive LO/IQ hybrid modules A-B 707a-b to the sets of mixers in areas A-B 710a-b may be mixed with amplified received signals provided by receive amplifiers 746a-h (e.g., LNAs) to produce in-phase and quadrature downconverted signals. The downconverted (in-phase) signals may be provided to a first receive phase rotator (PR), beamforming (BF) and analog-to-digital converter (ADC) module 701a (PR/BF/ADC 701a). The downconverted (quadrature) signals may be provided to a second receive phase rotator (PR), beamforming (BF) and analog-to-digital converter (ADC) module 701b (PR/BF/ADC 701b). The PR/BF/ADCs 701a-b may provide functionality similar to and/or be configured similar to the rotators 456a-n, beamforming circuitries 436a-b and analog-to-digital converters 468a-b described in connection with FIG. 4 above. The PR/BF/ADCs 701a-b may perform operations on the downconverted signals and provide the resulting signals to a demodulator 730a (which may be part of a modem, for example).

It should be noted that the first receive PR/BF/ADC 701a and the second receive PR/BF/ADC 701b may be coupled to sets of mixers in areas A-B 710a-b, even though the couplings or connections are not explicitly illustrated in FIG. 7 for convenience. For example, the first receive PR/BF/ADC 701a may be coupled to sets of mixers in areas A-B 710a-b that provide downconverted in-phase signals and the second receive PR/BF/ADC 701b may be coupled to sets of mixers in areas A-B 710a-b that provide downconverted quadrature signals.

A modulator 730b (which may be part of a modem, for example) may provide signals (e.g., modulated signals) to a first transmit phase rotator (PR), beamforming (BF) and digital-to-analog converter (DAC) module 703a (PR/BF/DAC 703a) and to a second transmit phase rotator (PR), beamforming (BF) and digital-to-analog converter (DAC) module 703b (PR/BF/DAC 703b) to produce signals for transmission. The in-phase and quadrature millimeter-wavelength oscillator signals provided by the transmit LO/IQ hybrid modules C-D 711c-d to the sets of mixers in areas C-D 710c-d may be respectively mixed with the signals for transmission from the first transmit PR/BF/DAC 703a to produce upconverted in-phase signals and with signals for transmission from the second transmit PR/BF/DAC 703b to produce upconverted quadrature signals. The upconverted in-phase and quadrature signals may be provided to transmit amplifiers 748a-h (e.g., PAs), which may amplify the signals for transmission. The PR/BF/DACs 703a-b may provide functionality similar to and/or be configured similar to the rotators 576a-n, beamforming circuitries 536a-b and digital-to-analog converters 572a-b described in connection with FIG. 5 above. The signals that are amplified for transmission may be provided to antennas, for example.

It should be noted that the first transmit PR/BF/DAC 703a and the second transmit PR/BF/DAC 703b may be coupled to sets of mixers in areas C-D 710c-d, even though the couplings or connections are not explicitly illustrated in FIG. 7 for convenience. For example, the first transmit PR/BF/DAC 703a may be coupled to sets of mixers in areas C-D that provide upconverted in-phase signals and the second transmit PR/BF/DAC 703b may be coupled to sets of mixers in areas C-D 710c-d that provide upconverted quadrature signals.

In some configurations, pairs of transmit amplifiers 748a-h and receive amplifiers 746a-h may be coupled to antennas (e.g., antennas 350). For example, the first receive amplifier 746a and the first transmit amplifier 748a may be coupled to a first antenna. Additionally, the second receive amplifier 746b and the second transmit amplifier 748b may be coupled to a second antenna and so forth.

Figure 8:
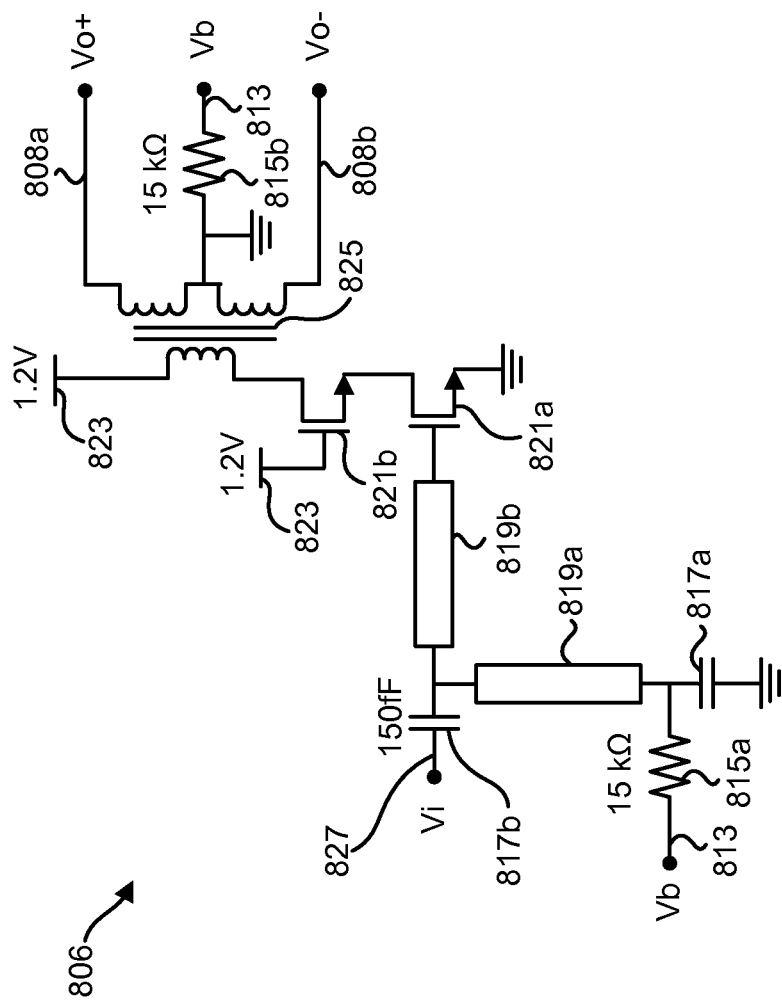
FIG. 8 is a circuit diagram illustrating one example of a local oscillator buffer that may be used in accordance with the systems and methods disclosed herein.

FIG. 8 is a circuit diagram illustrating one example of a local oscillator buffer 806 that may be used in accordance with the systems and methods disclosed herein. The local oscillator buffer 806 may be one example of the local oscillator 106 described in connection with FIG. 1. It should be noted that although some specific values (e.g., 150 femto farads (fF), 15 kilohm (kΩ), 1.2 volts (V)) are illustrated in FIG. 8, other values may be used in accordance with the systems and methods disclosed herein.

In this example, a voltage (Vb) is coupled (e.g., provided) to a first resistor 815a. The first resistor 815a may be coupled to a first capacitor 817a, which is coupled to ground and a first impedance 819a. The first impedance 819a may include one or more circuit components, such as inductors, capacitors and/or resistors. The first impedance 819a may be coupled to a second capacitor 817b and a second impedance 819b. An input voltage 827 (e.g., from a voltage controlled oscillator and/or IQ hybrid circuit) may be provided to the second capacitor 817b.

The second impedance 819b may be coupled to the gate of a first transistor 821a. The first transistor 821a is coupled to ground and to a second transistor 821b. A supply voltage 823 may be provided to the second transistor 821b. The second transistor 821b may be coupled to a transformer 825. The supply voltage 823 is provided to the transformer 825. The transformer 825 is coupled to ground and to a second resistor 815b. The second resistor 815b is coupled to the voltage 813. The transformer 825 may provide a positive signal 808a and a negative signal 808b. The positive and negative signals 808a-b may constitute a millimeter-wavelength differential pair. For example, the positive and negative signals 808a-b may be provided to mixers (e.g., mixer 112) in accordance with the systems and methods disclosed herein.

Figure 9:
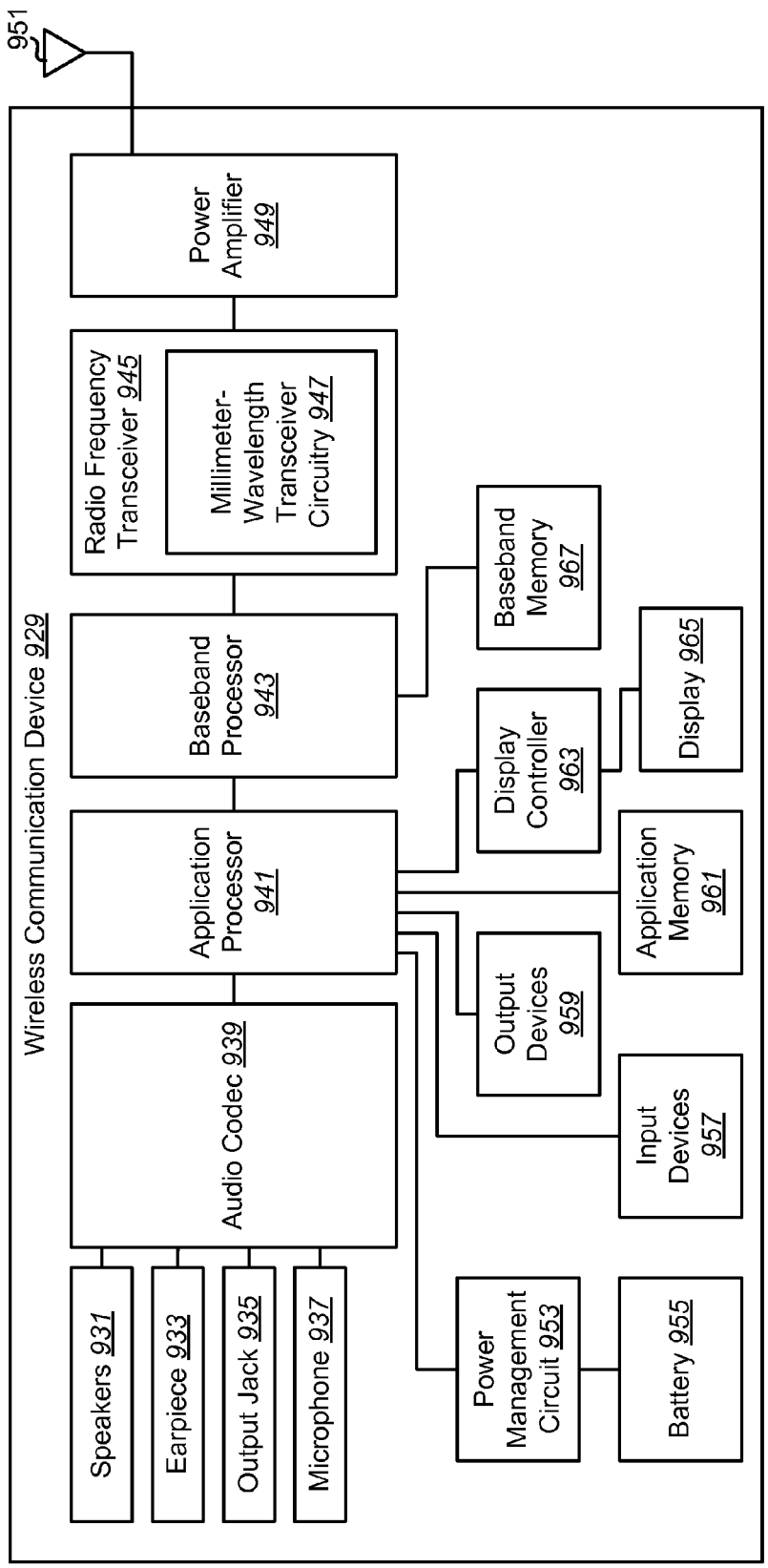
FIG. 9 is a block diagram illustrating one configuration of a wireless communication device in which systems and methods for mixing millimeter-wavelength signals may be implemented.

FIG. 9 is a block diagram illustrating one configuration of a wireless communication device 929 in which systems and methods for mixing millimeter-wavelength signals may be implemented. The wireless communication device 929 may be one example of the communication device 318 described above. The wireless communication device 929 may include an application processor 941. The application processor 941 generally processes instructions (e.g., runs programs) to perform functions on the wireless communication device 929. The application processor 941 may be coupled to an audio coder/decoder (codec) 939.

The audio codec 939 may be an electronic device (e.g., integrated circuit) used for coding and/or decoding audio signals. The audio codec 939 may be coupled to one or more speakers 931, an earpiece 933, an output jack 935 and/or one or more microphones 937. The speakers 931 may include one or more electro-acoustic transducers that convert electrical or electronic signals into acoustic signals. For example, the speakers 931 may be used to play music or output a speakerphone conversation, etc. The earpiece 933 may be another speaker or electro-acoustic transducer that can be used to output acoustic signals (e.g., speech signals) to a user. For example, the earpiece 933 may be used such that only a user may reliably hear the acoustic signal. The output jack 935 may be used for coupling other devices to the wireless communication device 929 for outputting audio, such as headphones. The speakers 931, earpiece 933 and/or output jack 935 may generally be used for outputting an audio signal from the audio codec 939. The one or more microphones 937 may be one or more acousto-electric transducers that convert an acoustic signal (such as a user's voice) into electrical or electronic signals that are provided to the audio codec 939.

The application processor 941 may also be coupled to a power management circuit 953. One example of the power management circuit 953 is a power management integrated circuit (PMIC), which may be used to manage the electrical power consumption of the wireless communication device 929. The power management circuit 953 may be coupled to a battery 955. The battery 955 may generally provide electrical power to the wireless communication device 929. Although not explicitly illustrated in FIG. 9, it should be noted that the battery 955 and/or the power management circuit 953 may be coupled to one or more of the elements illustrated as included within the wireless communication device 929.

The application processor 941 may be coupled to one or more input devices 957 for receiving input. Examples of input devices 957 include infrared sensors, image sensors, accelerometers, touch sensors, keypads, etc. The input devices 957 may allow user interaction with the wireless communication device 929. The application processor 941 may also be coupled to one or more output devices 959. Examples of output devices 959 include printers, projectors, screens, haptic devices, etc. The output devices 959 may allow the wireless communication device 929 to produce output that may be experienced by a user.

The application processor 941 may be coupled to application memory 961. The application memory 961 may be any electronic device that is capable of storing electronic information. Examples of application memory 961 include double data rate synchronous dynamic random access memory (DDRAM), synchronous dynamic random access memory (SDRAM), flash memory, etc. The application memory 961 may provide storage for the application processor 941. For instance, the application memory 961 may store data and/or instructions for the functioning of programs that are run on the application processor 941.

The application processor 941 may be coupled to a display controller 963, which in turn may be coupled to a display 965. The display controller 963 may be a hardware block that is used to generate images on the display 965. For example, the display controller 963 may translate instructions and/or data from the application processor 941 into images that can be presented on the display 965. Examples of the display 965 include liquid crystal display (LCD) panels, light emitting diode (LED) panels, cathode ray tube (CRT) displays, plasma displays, etc.

The application processor 941 may be coupled to a baseband processor 943. The baseband processor 943 generally processes communication signals. For example, the baseband processor 943 may demodulate and/or decode received signals. Additionally or alternatively, the baseband processor 943 may encode and/or modulate signals in preparation for transmission.

The baseband processor 943 may be coupled to baseband memory 967. The baseband memory 967 may be any electronic device capable of storing electronic information, such as SDRAM, DDRAM, flash memory, etc. The baseband processor 943 may read information (e.g., instructions and/or data) from and/or write information to the baseband memory 967. Additionally or alternatively, the baseband processor 943 may use instructions and/or data stored in the baseband memory 967 to perform communication operations.

The baseband processor 943 may be coupled to a radio frequency (RF) transceiver 945. The RF transceiver 945 may be coupled to a power amplifier 949 and one or more antennas 951. The RF transceiver 945 may transmit and/or receive radio frequency signals. For example, the RF transceiver 945 may transmit an RF signal using a power amplifier 949 and one or more antennas 951. The RF transceiver 945 may also receive RF signals using the one or more antennas 951.

The RF transceiver 945 may include millimeter-wavelength transceiver circuitry 947. For example, the millimeter-wavelength transceiver circuitry 947 may be an example of one or more of the millimeter-wavelength transceiver circuitries 104, 304 described above. More specifically, one or more of the elements illustrated in FIGS. 1, 3-8 may be included in the millimeter-wavelength transceiver circuitry 947. Additionally or alternatively, the millimeter-wavelength transceiver circuitry 947 may perform the method 200 described in connection with FIG. 2.

Figure 10:
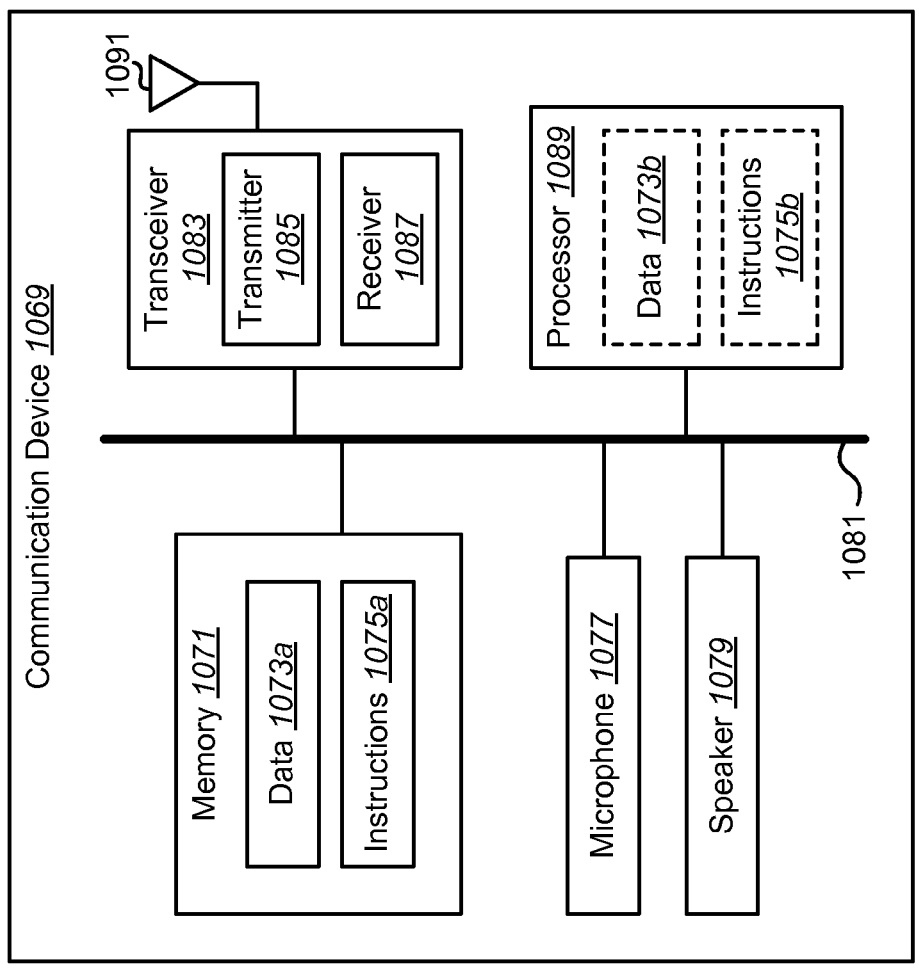
FIG. 10 illustrates components that may be included within a communication device.

FIG. 10 illustrates components that may be included within a communication device 1069. One or more of the devices (e.g., integrated circuit 102, communication device 318) described above may be configured similarly to the communication device 1069 that is shown in FIG. 10.

The communication device 1069 includes a processor 1089. The processor 1089 may be a general purpose single- or multi-chip microprocessor (e.g., an ARM), a special purpose microprocessor (e.g., a digital signal processor (DSP)), a microcontroller, a programmable gate array, etc. The processor 1089 may be referred to as a central processing unit (CPU). Although just a single processor 1089 is shown in the communication device 1069 of FIG. 10, in an alternative configuration, a combination of processors (e.g., an ARM and DSP) could be used.

The communication device 1069 also includes memory 1071 in electronic communication with the processor 1089 (i.e., the processor 1089 can read information from and/or write information to the memory 1071). The memory 1071 may be any electronic component capable of storing electronic information. The memory 1071 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1073*a* and instructions 1075*a* may be stored in the memory 1071. The instructions 1075*a* may include one or more programs, routines, sub-routines, functions, procedures, code, etc. The instructions 1075*a* may include a single computer-readable statement or many computer-readable statements. The instructions 1075*a* may be executable by the processor 1089 to implement the method 200 described above. Executing the instructions 1075*a* may involve the use of the data 1073*a* that is stored in the memory 1071. FIG. 10 shows some instructions 1075*b* and data 1073*b* being loaded into the processor 1089 (which may come from instructions 1075*a* and data 1073*a*).

The communication device 1069 may also include a transmitter 1085 and a receiver 1087 to allow transmission and reception of signals between the communication device 1069 and a remote location (e.g., another electronic device, communication device, etc.). The transmitter 1085 and receiver 1087 may be collectively referred to as a transceiver 1083. An antenna 1091 may be electrically coupled to the transceiver 1083. The communication device 1069 may also include (not shown) multiple transmitters, multiple receivers, multiple transceivers and/or multiple antenna.

In some configurations, the communication device 1069 may include one or more microphones 1077 for capturing acoustic signals. In one configuration, a microphone 1077 may be a transducer that converts acoustic signals (e.g., voice, speech) into electrical or electronic signals. Additionally or alternatively, the communication device 1069 may include one or more speakers 1079. In one configuration, a speaker 1079 may be a transducer that converts electrical or electronic signals into acoustic signals.

The various components of the communication device 1069 may be coupled together by one or more buses, which may include a power bus, a control signal bus, a status signal bus, a data bus, etc. For simplicity, the various buses are illustrated in FIG. 10 as a bus system 1081.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc, where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit, comprising:
    millimeter-wavelength transceiver circuitry, comprising:
        a local oscillator that generates a millimeter-wavelength oscillator signal; and
        a plurality of receive chain mixers and transmit chain mixers that are coupled to the local oscillator, wherein the plurality of mixers are within an area without millimeter-wavelength structures, wherein the plurality of mixers convert signals based on the millimeter-wavelength oscillator signal, wherein the receive chain mixers perform downconversion and the transmit chain mixers perform upconversion, and wherein the receive chain mixers and the transmit chain mixers operate based on the millimeter-wavelength oscillator signal from the local oscillator.

2. The integrated circuit of claim 1, wherein the plurality of receive chain mixers convert signals to baseband and wherein the plurality of transmit chain mixers convert baseband signals to radio frequency signals.

3. The integrated circuit of claim 1, wherein the plurality of receive chain mixers and transmit chain mixers are coupled to the local oscillator without millimeter-wavelength structures.

4. The integrated circuit of claim 1, wherein the area does not include structures for handling transmission line effects.

5. The integrated circuit of claim 1, wherein the area does not include a Wilkinson divider.

6. The integrated circuit of claim 1, wherein the area has a dimension smaller than $$\frac{\lambda}{10},$$

wherein $\lambda$ is an effective wavelength of the millimeter-wavelength oscillator signal.

7. The integrated circuit of claim 1, wherein the millimeter-wavelength oscillator signal has a frequency of approximately 60 gigahertz (GHz).

8. The integrated circuit of claim 1, wherein the plurality of mixers are coupled to beamforming circuitry.

9. The integrated circuit of claim 1, wherein the integrated circuit is included in a wireless communication device.

10. A method for mixing millimeter-wavelength signals on an integrated circuit, comprising:
    generating a millimeter-wavelength oscillator signal on millimeter-wavelength transceiver circuitry;
    providing the millimeter-wavelength oscillator signal to a plurality of receive chain mixers and transmit chain mixers within an area without millimeter-wavelength structures, wherein the receive chain mixers perform downconversion and the transmit chain mixers perform upconversion, and wherein the receive chain mixers and the transmit chain mixers operate based on the millimeter-wavelength oscillator signal; and
    converting signals based on the millimeter-wavelength oscillator signal.

11. The method of claim 10, wherein the signals are baseband signals.

12. The method of claim 10, wherein the plurality of receive chain mixers and transmit chain mixers are coupled to a local oscillator without millimeter-wavelength structures.

13. The method of claim 10, wherein the area does not include structures for handling transmission line effects.

14. The method of claim 10, wherein the area does not include a Wilkinson divider.

15. The method of claim 10, wherein the area has a dimension smaller than $$\frac{\lambda}{10},$$

wherein $\lambda$ is an effective wavelength of the millimeter-wavelength oscillator signal.

16. The method of claim 10, wherein the millimeter-wavelength oscillator signal has a frequency of approximately 60 gigahertz (GHz).

17. The method of claim 10, wherein the signals are converted by mixers that are coupled to beamforming circuitry.

18. The method of claim 10, wherein the integrated circuit is included in a wireless communication device.

19. A computer-program product for mixing millimeter-wavelength signals, comprising a non-transitory tangible computer-readable medium having instructions thereon, the instructions comprising:
    code for causing an integrated circuit to generate a millimeter-wavelength oscillator signal on millimeter-wavelength transceiver circuitry;
    code for causing the integrated circuit to provide the millimeter-wavelength oscillator signal to a plurality of receive chain mixers and transmit chain mixers within an area without millimeter-wavelength structures, wherein the receive chain mixers perform downconversion and the transmit chain mixers perform upconversion, and wherein the receive chain mixers and the transmit chain mixers operate based on the millimeter-wavelength oscillator signal; and code for causing the integrated circuit to convert signals based on the millimeter- wavelength oscillator signal.

20. The computer-program product of claim 19, wherein the signals are baseband signals.

21. The computer-program product of claim 19, wherein the plurality of receive chain mixers and transmit chain mixers are coupled to a local oscillator without millimeter-wavelength structures.

22. The computer-program product of claim 19, wherein the area does not include structures for handling transmission line effects.

23. The computer-program product of claim 19, wherein the area does not include a Wilkinson divider.

24. The computer-program product of claim 19, wherein the area has a dimension smaller than $$\frac{\lambda}{10},$$

wherein $\lambda$ is an effective wavelength of the millimeter-wavelength oscillator signal.

25. An apparatus for mixing millimeter-wavelength signals, comprising:

means for generating a millimeter-wavelength oscillator signal on millimeter-wavelength transceiver circuitry;

means for providing the millimeter-wavelength oscillator signal to a plurality of means for mixing receive chain signals and means for mixing transmit chain signals within an area without millimeter-wavelength structures, wherein the means for mixing receive chain signals perform downconversion and means for mixing transmit chain signals perform upconversion, and wherein the receive chain mixers and the transmit chain mixers operate based on the millimeter-wavelength oscillator signal; and means for converting signals based on the millimeter-wavelength oscillator signal.

26. The apparatus of claim 25, wherein the signals are baseband signals.

27. The apparatus of claim 25, wherein the plurality of means for mixing receive chain signals and means for mixing transmit chain signals are coupled to the means for generating the millimeter-wavelength oscillator signal without millimeter-wavelength structures.

28. The apparatus of claim 25, wherein the area does not include structures for handling transmission line effects.

29. The apparatus of claim 25, wherein the area does not include a Wilkinson divider.

30. The apparatus of claim 25, wherein the area has a dimension smaller than $$\frac{\lambda}{10},$$

wherein $\lambda$ is an effective wavelength of the millimeter-wavelength oscillator signal.

31. The integrated circuit of claim 1, wherein the plurality of mixers comprise a plurality of pairs of receive chain mixers and a plurality of pairs of transmit chain mixers.

32. The integrated circuit of claim 31, wherein the plurality of pairs of receive chain mixers and the plurality of pairs of transmit chain mixers are clustered within the area.

33. The integrated circuit of claim 31, wherein the plurality of mixers are coupled to the local oscillator to receive one pair of clock signals to directly drive the plurality of pairs of receive chain mixers and the plurality of pairs of transmit chain mixers.

34. The integrated circuit of claim 31, wherein the plurality of mixers are coupled to the local oscillator to receive a plurality of pairs of clock signals to separately drive respective pairs of the plurality of pairs of receive chain mixers and the plurality of pairs of transmit chain mixers.

* * * * *